United States Patent [19]
Chiulli et al.

[11] Patent Number: 5,667,920
[45] Date of Patent: Sep. 16, 1997

[54] PROCESS FOR PREPARING A COLOR FILTER

[75] Inventors: Carl A. Chiulli, Randolph, Mass.; John E. MacLatchy, Dover, N.H.; Harris R. Miller, Boston, Mass.

[73] Assignee: Polaroid Corporation, Cambridge, Mass.

[21] Appl. No.: 613,849

[22] Filed: Mar. 11, 1996

[51] Int. Cl.$^6$ .................... G02B 5/20; G02F 1/1335; G03F 7/00
[52] U.S. Cl. ............... 430/7; 430/321; 349/106; 257/440
[58] Field of Search ............ 430/7, 321; 257/440; 349/106; 348/273

[56] References Cited

U.S. PATENT DOCUMENTS

| | | | |
|---|---|---|---|
| 3,873,361 | 3/1975 | Franco et al. | 117/212 |
| 4,239,842 | 12/1980 | Sandhu | 430/7 |
| 4,565,756 | 1/1986 | Needs et al. | 430/7 |
| 4,721,999 | 1/1988 | Takemura et al. | 430/7 |
| 4,808,501 | 2/1989 | Chiulli | 430/7 |
| 4,808,511 | 2/1989 | Holmes | 430/325 |
| 4,999,280 | 3/1991 | Hiraoka | 430/330 |
| 5,059,500 | 10/1991 | Needham et al. | 430/7 |

FOREIGN PATENT DOCUMENTS

| | | |
|---|---|---|
| 5-019115 | 1/1993 | Japan . |
| 7-331102 | 12/1995 | Japan . |

OTHER PUBLICATIONS

Hiraoka et al., J. Vac. Sci. Technol. B, 7(6), 1760 (1989).
Shaw et al., J. Vac. Sci. Technol. B, 7(6), 1709 (1989).

*Primary Examiner*—John A. McPherson
*Attorney, Agent, or Firm*—David J. Cole

[57] ABSTRACT

A substrate (typically a solid state imager or a liquid crystal display device) is provided with a filter by forming a layer of photoresist on the substrate, and exposing and developing the photoresist to produce filter elements from the portions of the layer of photoresist remaining after the development. After development of the layer of photoresist, the substrate is treated with a silylation compound capable of cross-linking the photoresist and of promoting adhesion of the photoresist to the substrate. A preferred silylation compound is hexamethylcyclotrisilizane.

25 Claims, No Drawings

PROCESS FOR PREPARING A COLOR FILTER

BACKGROUND OF THE INVENTION

This invention relates to a process for forming a filter on a substrate, especially a solid state imager or a liquid crystal display device, and to a solid state imager or liquid crystal display device provided with this filter.

The term "filter" or "filter layer" is used herein to mean the whole layer placed upon a substrate to control the passage of electromagnetic radiation to or from this substrate; this filter may have portions of one or more colors. The term "filter element" is used to refer to a single physically continuous element of the filter of the same color throughout; such a filter element may be a dot or a stripe or have a different physical form. The term "set of filter elements" refers to a plurality of filter elements of the same color physically separated from one another. The term "having color" is used to mean "transmitting at least a portion of electromagnetic radiation of a particular wavelength", and does not necessarily refer to visible radiation; as those skilled in solid state imager technology are well aware, such imagers can be made sensitive to wavelengths well beyond the reach of the human eye and there are important applications, such as night vision equipment and aerospace reconnaissance, which require the formation of multiple set of filter elements which pass only predetermined infra-red or ultra-violet wavelengths, even though such filter elements appear opaque to the human eye. The term "baked" is used with reference to filters and refers to an exposure to an elevated temperature for a period sufficient to cause substantial cross-linking of the photoresist in the filter elements, thereby effecting a substantial increase in the stability of these elements; typically the baking of filter elements involves exposure to temperatures of about 2 to 3 hours at a temperature of 140°–150° C. The term "soft baked" is used with reference to the production of filters and refers to an exposure to an elevated temperature for a brief period sufficient to drive off solvent present in a photoresist layer, but insufficient to cause any significant change in cross-linking or stability of this layer; typically, such soft baking is carried out for 1 to 2 minutes at a temperature of about 90°–100° C.

To obtain a color image using solid state imagers such as charge coupled devices, optical filters in a multicolor stripe or mosaic form are employed; in many cases, these filters are formed directly upon the photosensitive surface of the solid state imager. Similarly, in color liquid crystal display devices, optical filters in a multicolor stripe or mosaic form are provided to control the color of the light which is reflected from, or passes through, the "light gate" provided by each individual liquid crystal pixel. Both these types of filters are normally provided with elements having two or three differing colors. For example, a two color filter may have yellow and cyan elements which overlap in part, with the overlap area providing, in effect, a green element. A three color filter will typically have red, green and blue, or cyan, magenta and yellow elements.

A number of processes are described in the art for preparing such filters. For example, U.S. Pat. No. 4,239,842 describes a process for producing a color filter array by depositing successively on a semi-conductive layer, such as a charge coupled device, a sub-coat, a polymeric mordant, and a photoresist. The photoresist layer is exposed and developed to form a mask, and dye is then heat transferred through the apertures in the photoresist into the polymeric mordant. Finally, the photoresist is stripped.

U.S. Pat. No. 4,565,756 describes a process for forming a color filter. This process comprises laying on a substrate a transparent layer, forming by photolithography in this transparent layer a pattern of filter elements separated by separation regions (grooves or dye-impermeable regions), laying a barrier layer over the transparent layer, forming by photolithography a pattern of apertures in the barrier layer, this pattern of apertures corresponding to the location of a first system of filter elements, dyeing the first system of filter elements through these apertures, and finally removing the barrier layer. The formation of the barrier layer and the subsequent steps of the process are then repeated for other colors.

A variety of techniques have also been developed for producing the fine lines and other image elements needed in the production of integrated electrical circuits and in lithography. For example, U.S. Pat. No. 3,873,361 describes a process for producing thin films for integrated circuits by depositing a) a photoresist (polymeric) layer which is baked to render it non-photosensitive; b) a metallic layer; c) a second photoresist layer, then exposing and developing the second photoresist layer to form a mask, etching the exposed metallic layer through this mask, using the metallic mask so produced to remove exposed polymeric layer, preferably by sputter etching, depositing a metallic film in areas where the bottom polymeric layer has been removed, and finally removing, by conventional lift-off solvent methods, the remaining parts of the metallic layer and the bottom polymeric layer.

U.S. Pat. No. 4,808,501 describes a process for forming a color filter on a support, such as a charge coupled device, by (a) forming a layer on a support with a composition comprising a positive photoresist and a dye, the dye being soluble in the solvent of the photoresist; (b) exposing predetermined portions of the layer to radiation adapted to increase the solubility of the coating in the exposed areas; (c) developing the exposed areas to form a pattern of filter elements; and (d) repeating these steps with a different color dye in the composition; wherein the dye constitutes in excess of 10% by weight, dry basis of the composition, is substantially non-absorptive in the exposure wavelength of the composition, and provides predetermined absorptive characteristics for the specified filter element and the dye possesses substantially the same polarity as the composition. In practice, after the exposed areas have been developed, the patterned photoresist must be baked, typically at 140°–150° C. for 1 to 3 hours, to stabilize the filter elements.

U.S. Pat. No. 5,059,500 describes a process for forming a filter using differential reactive ion etching techniques. This process comprises:

providing on the substrate a layer of an absorber material having predetermined absorption and transmission characteristics;

providing a layer of a barrier material superposed on the layer of absorber material, the barrier material being more susceptible to reactive ion etching than the absorber material under a first set of etching conditions, but resistant to reactive ion etching under a second set of etching conditions under which the absorber material is susceptible to etching;

providing a layer of a photoresist material superposed on the layer of barrier material;

patternwise exposing the layer of photoresist material and developing the exposed layer to remove either the exposed or non exposed regions thereof, thereby to bare the regions of the barrier layer underlying the removed regions of the photoresist material, the remaining regions of the photoresist material being resistant to reactive ion etching under said first set of etching conditions but susceptible to reactive ion etching under said second set of etching conditions;

reactive ion etching the coated substrate under said first set of etching conditions, thereby etching away the bared regions of the barrier layer and baring selected regions parts of the absorber layer, but not etching away the remaining regions of the photoresist material nor substantially etching away the bared regions of the absorber layer; and reactive ion etching the coated substrate under said second set of etching conditions, thereby etching away the remaining regions of the photoresist layer and the bared regions of the absorber layer, and thereby forming a filter on the substrate.

The processes described in the aforementioned U.S. Pat. Nos. 4,808,501 and 5,059,500 give excellent results. However, the process of U.S. Pat. No. 5,059,500 requires the use of reactive ion etching equipment. The process of U.S. Pat. No. 4,808,501 requires three separate baking steps and imposes a number of stringent requirements upon the dye. As discussed in this patent, the dye must be sufficiently soluble in the photoresist resin that the relatively concentrated dye solution required for the process can be achieved, without the dye tending to precipitate out, either during the formation of the filter, or during the long service life (of the order of several years) of the solid state imager. Furthermore, the dye must be sufficiently stable in solution and sufficiently stable in the filter elements to withstand, without unacceptable color loss, the thermal or radiation-exposure treatments which are normally required to stabilize the filter elements of each color before the next color is applied; if this thermal or radiation-exposure treatment is omitted, the solvent used to deposit the second layer of photoresist tends to redissolve the first set of filter elements, thereby deforming the filter elements, reducing the selectivity of the filter, promoting cross-talk between the various color channels of light passing through the filter and tending to reduce the resolution of the filter. The dye must also not interfere with development of the exposed areas of the photoresist. Finally, the dye must be substantially non-absorptive in the exposure wavelength of the composition. This combination of requirements greatly limits the choice of dyes which can be used in the process of U.S. Pat. No. 4,808,501, and thus tends to increase the cost of the process. In particular, the requirement that the dye withstand a thermal stabilization treatment eliminates numerous dyes from being used in the process, and increases the concentrations of other dyes which must be used, since many dyes which can survive a thermal stabilization undergo significant color loss during this step. A thermal stabilization treatment also creates other problems, especially reflowing and yellowing of the photoresist, which distorts and discolors the filter elements, thus reducing the resolution and sensitivity of the device, and may reduce yields by rendering certain filters unacceptable.

It has now been found that the number of dyes useful in the process of U.S. Pat. No. 4,808,501 and similar processes for forming filters can be increased by treating the filter elements formed by development of the photoresist with a particular type of silylating compound. Pre-treatment of the substrate with this particular type of silylating compound prior to application of photoresist to the substrate can also help to promote adhesion of the photoresist to the substrate.

SUMMARY OF THE INVENTION

Accordingly, this invention provides a process for forming a filter on a substrate, which process comprises: forming a layer of a photoresist on the substrate; exposing portions of the layer of photoresist to radiation effective to change the solubility of the exposed portions of the photoresist; and developing the exposed layer of photoresist by removing from the substrate one of the exposed and unexposed portions of the layer of photoresist, thereby producing filter elements from the remaining portions of the layer of photoresist. In the present process, the substrate is treated, after formation of the filter elements thereon, with a silylation compound having at least two functional groups, this silylation compound being capable of cross-linking the photoresist, and of promoting adhesion of the photoresist to the substrate.

A preferred form of the process of the invention comprises:

forming, on the solid state imager, a layer of a first photoresist composition comprising a photoresist and a first dye;

exposing portions of the layer of first photoresist composition to radiation effective to change the solubility of the exposed portions of the photoresist composition;

developing the exposed layer of first photoresist composition by removing from the substrate one of the exposed and unexposed portions of the layer of first photoresist composition, thereby producing first filter elements from the remaining portions of the layer of first photoresist composition;

thereafter, treating the substrate with a silylation compound having at least two functional groups, this silylation compound being capable of cross-linking the photoresist in the first filter elements, and of promoting adhesion of this photoresist to the substrate;

thereafter forming, on the substrate bearing the first filter elements, a layer of a second photoresist composition comprising a photoresist and a second dye, the second dye having radiation absorption characteristics different from those of the first dye;

exposing portions of the layer of second photoresist composition to radiation effective to change the solubility of the exposed portions of the photoresist composition;

developing the exposed layer of second photoresist composition by removing from the substrate one of the exposed and unexposed portions of the layer of second photoresist composition, thereby producing second filter elements from the remaining portions of the layer of second photoresist composition;

thereafter, treating the substrate with a silylation compound having at least two functional groups, this silylation compound being capable of cross-linking the photoresist in the second filter elements, and of promoting adhesion of this photoresist to the substrate;

thereafter forming, on the substrate bearing the first and second filter elements, a layer of a third photoresist composition comprising a photoresist and a third dye, the third dye having radiation absorption characteristics different from those of the first and second dyes;

exposing portions of the layer of third photoresist composition to radiation effective to change the solubility of the exposed portions of the photoresist composition;

developing the exposed layer of third photoresist composition by removing from the substrate one of the exposed and unexposed portions of the layer of third photoresist composition, thereby producing third filter elements from the remaining portions of the layer of third photoresist composition; and thereafter, treating the substrate with a silylation compound having at least two functional groups, this silylation compound being capable of cross-linking the photoresist in the third filter elements.

It will be appreciated that, in this multi-step preferred process, it is not essential that the same silylation compound and photoresist resin be used in each of the three layers of photoresist composition, provided that the silylation compound used in each step is capable of cross-linking and promoting adhesion of the photoresist used in the filter elements formed in the preceding step.

This invention also provides a solid state imager having a radiation-sensitive surface bearing a filter comprising first, second and third sets of filter elements, these filter elements comprising a photoresist, each of the filter elements having the same radiation absorption characteristics as the other filter elements of the set to which it belongs but different radiation absorption characteristics from the filter elements of the other two sets, and wherein at least one of the sets of filter elements contains a residue of a silylation compound capable of cross-linking the photoresist and of promoting adhesion of the photoresist to the radiation-sensitive surface of the solid state imager.

DETAILED DESCRIPTION OF THE INVENTION

As already mentioned, in the process of the present invention the substrate, on which a set of filter elements has been formed by development of a photoresist layer, is treated with a silylation compound bearing at least two functional groups, this silylation compound being capable of cross-linking the photoresist in these filter elements, and of promoting adhesion of this photoresist to the substrate. Appropriate silylation compounds capable of producing these cross-linking and adhesion-promoting effects, with the types of photoresist resins conventionally used in the formation of color filters, are known to those skilled in the art, and are described for example in Shaw et al., "A simplified silylation process", J. Vac. Sci. Technol. B, 7(6), 1709 (1989); Hiraoka et al., "Vapor phase silylation of resist images", J. Vac. Sci. Technol. B, 7(6), 1760 (1989); and U.S. Pat. Nos. 4,999,280 and 4,808,511. A specific preferred silylation compound is hexamethylcyclotrisilizane (HMCTS); the other compounds described in the aforementioned papers and patents as useful for cross-linking photoresists by incorporating silicon into the polymer matrix, for example 1,1,3,3-tetramethyldisilizane (TMDS), tetramethyl-2, 5-disila-1-azacyclopentane (TDOCP), 2,2,5, 5-tetramethyl-2,5-disila-1-azacyclopentane (TDACP), octamethylcyclotrisilizane, 1,3-dichlorodimethyldiphenyldisiloxane; 1,7-dichlorooctamethyltetrasiloxane, and silylation compounds which produce an amine base upon reaction with the photoresist, or which contain a carboxylate leaving group (especially (N,N-dimethylamino)trimethylsilane and bis(dimethylamino)dimethylsilane) may also be useful in the present process. Hexamethyldisilizane should normally not be used in the present process, since this compound acts as an adhesion promoter, but also inhibits the cross-linking, and increases solubility in organic solvents, of most photoresists.

Most unexpectedly, it has been found that the post-treatment of the substrate with the silylation compound stabilizes the filter elements previously formed on the substrate against solvent attack during the deposition of the next layer of photoresist to such an extent that the conventional thermal stabilization step can usually be eliminated, or at least very greatly reduced in temperature and/or duration. Elimination of the thermal stabilization step avoids the problems of dye degradation, decolorization or loss which may occur during this step, and this renders many more dyes usable in the present process. Furthermore, elimination of the thermal stabilization step also avoids the problem of photoresist reflow which may occur during this step, and thus tends to improve imager resolution and yield. Finally, elimination of the thermal stabilization step reduces the overall time required to form the filter on the substrate (since the silylation post-treatment can be carried out in a few minutes, whereas a conventional thermal stabilization step requires a few hours) and thus improves productivity while reducing energy consumption. Accordingly, in a process of the invention in which the steps of forming a layer of photoresist, exposing and developing the photoresist, and treating the substrate with a silylation compound, are repeated to form second filter elements differing in absorption characteristics from the filter elements formed from the layer of photoresist first applied, preferably the substrate is not exposed to temperatures in excess of 100° C. for a period in excess of about 5 minutes between the first development step and the formation of the second layer of photoresist; indeed, desirably the substrate is not heated above ambient temperature between the first development step and the formation of the second layer of photoresist except during the treatment with the silylation compound (which, as illustrated in the Example below, is typically carried out at an elevated temperature, but for only a brief period).

In addition to the post-treatment of the filter elements with the silylation compound required by the present invention, it is usually advantageous to treat the substrate, prior to the formation of a layer of photoresist thereon, with a silylation compound having at least two functional groups, this silylation compound being capable of promoting adhesion of the photoresist to the substrate. This pre-treatment of the substrate with the silylation compound helps to secure firm adhesion of the photoresist to the substrate, thereby improving the stability of the filter.

The treatment(s) of the substrate with the silylation compound may be carried out using conventional techniques, either in the vapor phase or in the liquid phase, although the former is preferred. Typically, vapor phase silylation is effected by contacting the substrate with the vapor of the silylation compound (preferably HMCTS) at a pressure of less than about 10 Torr, usually of the order of 1 Torr, and at an elevated temperature above 100° C. Liquid phase silylation is typically carried out using 10 percent w/w solution of HMCTS or another silylating agent in xylene for 4 minutes at 40° C.

In some processes of the invention, it is desirable to add to the silylating compound an additive which increases penetration of the silylating compound into the photoresist. Suitable penetration enhancing additives are known in the art; see, for example, the aforementioned Shaw et al. paper at page 1712. A preferred additive is N-methylpyrrolidinone.

The photoresist used in the present process can be of any type known in the art, provided of course that it undergoes cross-linking and adhesion promotion by the specific silylation compound employed. In general, the preferred photoresists are positive photoresists comprising a novolak resin; these resists can be developed in conventional fashion using an aqueous alkaline solution. As is well known to those skilled in the use of such resins, novolak resins require the use of sensitizers, typically substituted naphthoquinone diazide sensitizers, to render them photosensitive; for further details regarding appropriate novolak resins and sensitizers, see the aforementioned U.S. Pat. Nos. 4,808,501 and 5,268,245.

Commercial novolak resin photoresists may have the sensitizer dissolved in the solvent with the novolak resin, or may have the sensitizer covalently bonded to the resin. In certain cases, it has been found advantageous to have at least part of the photoresist used in the present process of the latter type, since it appears that the presence of a covalently bonded sensitizer promotes cross-linking of the photoresist.

Unless the photoresist used itself has the absorption characteristics required of the filter elements to be formed (and in most cases of practical importance this will not be the case), the filter elements will comprise both the photoresist and a dye. Typically, the present process is carried out by incorporating the dye into the photoresist before the photoresist is applied to the substrate, i.e., the "photoresist" which is applied to the substrate is actually a photoresist composition comprising a photoresist resin and a dye, so that the filter elements are formed with the dye already contained therein, as discussed in more detail below. However, the present invention may also be applied to a process in which at least one set of filter elements are colored by dyeing a photoresist after exposing and developing a layer of this photoresist. In such a case, the silylation treatment can be carried out after the dyeing step, so that the silylation stabilizes the dyed filter elements.

Desirably, the present process is carried out in accordance with the aforementioned U.S. Pat. No. 4,808,501, that is, the formation of the layer of photoresist is effected by solvent coating on to the substrate a dye-containing positive photoresist composition and drying this solvent coating to an adherent layer, the photoresist composition comprising a photoresist resin and a dye; this dye being soluble in the solvent of the photoresist composition and constituting in excess of 10 percent up to about 50 percent (and preferably in excess of 30 percent up to about 50 percent) of this composition, on a dry weight basis; the dye having substantially the same polarity as the resin, thereby interacting sufficiently with the resin and being sufficiently compatible therewith as not to form a separate phase from the coating photoresist composition; the dye providing the desired dye density and the predetermined absorption and transmission properties characteristic of the predetermined color desired in the filter elements to be prepared from the photoresist composition; the dye being sufficiently transmissive of the radiation used for exposure of the photoresist composition as to permit desired control of the solubility of the photoresist composition in areas of exposure and the formation, on development, of a pattern of filter elements having the predetermined absorption and transmission characteristics.

As already indicated, the process of the present invention is especially intended for forming filters on solid state imagers, especially charge coupled devices and complementary metal oxide semiconductor imagers. In a particularly preferred process, the charge coupled device is of a type comprising a plurality of spaced elements each defined by a surrounding channel stop, and the process comprises the step of predetermining the portions of the layer of photoresist to be exposed to radiation by masking selected ones of the spaced elements in such a manner that the edges of the filter elements formed after the exposure and development extend over the channel stop surrounding the selectively masked elements.

The highly stable filter elements which can be produced on solid state imagers by the present process are well-adapted for the production of microlenses overlying the filter elements. It is known that the quantum efficiency of solid state imagers can be improved by providing microlenses overlying the photosensitive regions of the imager and the filter elements which themselves overlie these photosensitive regions; the microlenses serve to divert light which would otherwise fall on to the non-photosensitive regions of the imager on to the photosensitive regions thereof. One conventional process for the formation of such microlenses is to first form discrete areas of photoresist overlying each photosensitive region (by coating a uniform layer of photoresist on to the imager, and exposing and developing this photoresist layer to leave square, rectangular, circular or elliptical prisms, or stripes, of the photoresist at the desired locations), and then to heat the imager above the glass transition temperature of the exposed and developed photoresist, thereby "melting" the discrete areas of photoresist. The surface tension of the melted photoresist causes each discrete area of photoresist to assume the form of a planoconvex microlens; where the areas of photoresist are in the form of stripes, these stripes are converted to hemicylindrical forms.

Unfortunately, the temperatures required to decrease the surface tension of the melted photoresist to a point where microlenses of the desired shape are formed are high, typically of the order of 165° C., and are thus higher than the temperatures used to bake the filter elements formed in prior art processes. Thus, the problems of photoresist discoloration and reflow, dye degradation and lack of adhesion of photoresist to the substrate which occur during prior art processes for the formation of filter elements (as discussed above) are encountered to an even greater extent during the formation of microlenses.

It has been found that the filter elements produced by preferred processes of the present invention are sufficiently stable that they can survive the high temperatures required for microlens formation, by the process described above, without significant dye degradation or photoresist reflow. In addition, it may be desirable to include an extra silylation step after formation of the last set of filter elements but before deposition of the photoresist layer used to form the microlenses, in order to improve adhesion of the microlenses to the underlying filter elements.

The present invention may also be applied to a process in which colored microlenses are formed on a substrate. In such a process, first second and third sets of discrete photoresist elements (each set being of a different color) are formed on the substrate, and then the photoresist elements are melted to form three sets of microlenses. In accordance with the present process, after these microlenses have been formed by melting the photoresist elements, the substrate is treated with a silylation compound capable of cross-linking the photoresist in the photoresist elements. Such silylation treatment can avoid the need for baking to stabilize the microlenses.

The following Example is now given, though by way of illustration only, to show details of particularly preferred reagents, conditions and techniques used in the process of the present invention.

EXAMPLE

This Example illustrates a process of the present invention for the formation of a full color filter having red, blue and green sets of filter elements in which a silylating pretreatment is effected prior to the formation of the first set of filter elements, a silylating post-treatment is effected after formation of each of the three sets of filter elements, and all baking steps are eliminated.

A 5 inch (127 mm) silicon wafer on which a charge coupled device has been fabricated was vapor treated with HMCTS at 145° C. and 1 Torr for 2 minutes. Following this silylation pre-treatment, the wafer was allowed to stand for one minute to cool, then 2 ml of a red photoresist composition was spin coated on to the wafer at 3250 rpm for 25 seconds. This red photoresist composition comprised a commercial phenol-formaldehyde novolak resin/naphthoquinone diazide sensitizer composition (OCG 825 50 centistokes resin, sold by Olin Microelectronic Materials, P.O. Box 1099, Mesa Ariz. 85216) and 12.8% (on a dry weight basis) of a red dye, namely Orasol Red B, manufactured by Ciba-Geigy Corporation The coated wafer was then soft baked on a hot plate for 110 seconds at 95° C. The wafer was aligned and given a 500 mJ/cm² exposure using an ASM PAS-2500 G-Line Stepper Camera (manufactured by ASM Lithography). Development was carried out by immersing the exposed wafer for 3 minutes in a 0.13M aqueous sodium metasilicate solution, rinsing for 30 seconds in deionized water and air drying to produce the red filter elements. The wafer was then vapor treated with HMCTS at 145° C. and 1 Torr for 2 minutes to stabilize the red filter elements.

To form blue filter elements, the wafer was allowed to stand for one minute to cool, then 2 ml of a blue photoresist composition was spin coated on to the wafer at 3000 rpm for 25 seconds. This blue photoresist composition comprised a commercial phenol-formaldehyde novolak resin/naphthoquinone diazide sensitizer composition (a 50:50 w/w mixture of the aforementioned OCG 825 and Futurrex PR1-2000 resin; the latter, sold by Futurrex, Inc., 44–50 Clinton Street, Newton N.J. 07860, has the sensitizer covalently bonded to the novolak resin), 3.3% of a blue dye, namely Sandoz Blue (Solvent Blue 36), the inner salt of 10-aminononadecane with 7-phenyl-5,9-bis(phenylamino)-4,10-disulfohydroxide, of the formula:

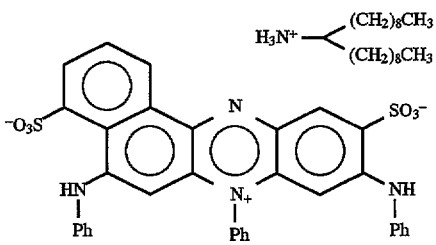

4.6 percent of a magenta dye of the formula:

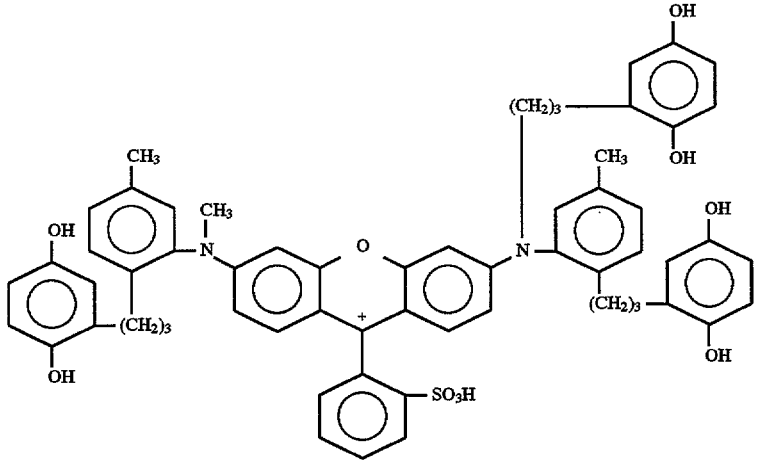

and 10.7 percent of a cyan dye of the formula:

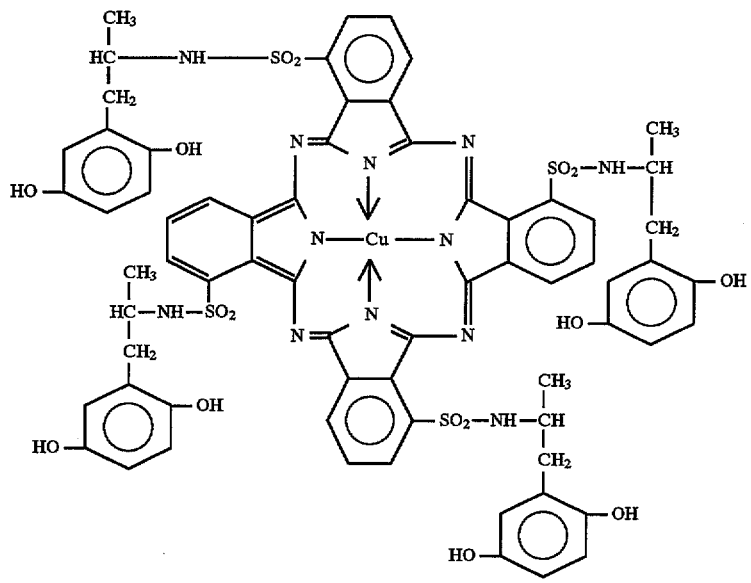

(All these percentages of dye are on a dry weight basis.). The coated wafer was then soft baked on a hot plate for 110 seconds at 95° C. The wafer was aligned and given a 600 mJ/cm$^2$ exposure using the ASM PAS-2500 G-Line Stepper Camera. Development was carried out by immersing the exposed wafer for 2.5 minutes in a 0.26M aqueous sodium metasilicate solution, rinsing for 30 seconds in deionized water and air drying to produce the blue filter elements. The wafer was then vapor treated with HMCTS at 145° C. and 1 Torr for 2 minutes to stabilize the blue filter elements.

To form green filter elements, the wafer was allowed to stand for one minute to cool, then 2 ml of a green photoresist composition was spin coated on to the wafer at 3000 rpm for 25 seconds. This green photoresist composition comprised a commercial phenol-formaldehyde novolak resin/ naphthoquinone diazide sensitizer composition (the aforementioned OCG 825), 14 percent of the same cyan dye as used in the blue photoresist composition and 10.3 percent of a yellow dye, namely Orasol Yellow 2GLN (manufactured by Ciba-Geigy Corporation. (These percentages of dye are on a dry weight basis.). The coated wafer was then soft baked on a hot plate for 110 seconds at 95° C. The wafer was aligned and given an 1100 mJ/cm$^2$ exposure using the ASM PAS-2500 G-Line Stepper Camera. Development was carried out by immersing the exposed wafer for 3.5 minutes in a 0.26M aqueous sodium metasilicate solution, rinsing for 30 seconds in deionized water and air drying to produce the green filter elements.

Finally, the wafer was again vapor treated with HMCTS at 145° C. and 1 Torr for 2 minutes to stabilize the color filter produced.

The foregoing process eliminates from a similar conventional process three baking steps (one after the formation of each of the three sets of filter elements), and each of these baking steps typically requires two to three hours; in the present process these multiple baking steps are replaced by three silylation treatments, each of which lasts only two minutes. Furthermore, no reflow of the photoresist or degradation of the dyes is observed during the silylation treatments, in contrast to the conventional steps, and the filter finally produced is sufficiently stable to allow the formation of microlenses thereon by melting "islands" of photoresist formed on the surface of the filter without reflow of the photoresist in the filter elements.

We claim:

1. In a process for forming a filter on a substrate, which process comprises:

forming a layer of a photoresist on the substrate;

exposing portions of the layer of photoresist to radiation effective to change the solubility of the exposed portions of the photoresist;

developing the exposed layer of photoresist by removing from the substrate one of the exposed and unexposed portions of the layer of photoresist, thereby producing filter elements from the remaining portions of the layer of photoresist, the improvement which comprises:

treating the substrate, after formation of the filter elements thereon, with a silylation compound having at least two functional groups, this silylation compound being capable of cross-linking the photoresist, and of promoting adhesion of the photoresist to the substrate.

2. A process according to claim 1 wherein the silylation compound comprises hexamethylcyclotrisilizane.

3. A process according to claim 1 wherein the silylation compound comprises one which produces an amine base upon reaction with the photoresist, or one which contains a carboxylate leaving group.

4. A process according to claim 3 wherein the silylation compound comprises (N,N-dimethylamino)trimethylsilane, bis(dimethylamino)dimethylsilane, 1,1,3,3,-tetramethyldisilazane, tetramethyl-2,5-disila-1-azacyclopentane, 2,2,5,5-tetramethyl-2,5-disila-1-azacyclopentane, octamethylcyclotfisilizane, 1,3-dichlorodimethyldiphenyldisiloxane or 1,7-dichlorooctamethyltetrasiloxane.

5. A process according to claim 1 wherein the steps of forming a layer of photoresist, exposing and developing the photoresist, and treating the substrate with a silylation compound, are repeated to form second filter elements differing in absorption characteristics from the filter elements formed from the layer of photoresist first applied, and wherein the substrate is not exposed to temperatures in excess of 100° C. for a period in excess of about 5 minutes between the first development step and the formation of the second layer of photoresist.

6. A process according to claim 5 wherein the substrate is not heated substantially above ambient temperature between the first development step and the formation of the second layer of photoresist except during the treatment with the silylation compound.

7. A process according to claim 1 wherein the substrate is treated, prior to the formation of the layer of photoresist thereon, with a silylation compound having at least two functional groups, this silylation compound being capable of promoting the adhesion of the photoresist to the substrate.

8. A process according to claim 1 wherein the treatment of the substrate with the silylation compound is effected by contacting the substrate with the vapor of the silylation compound at a pressure of less than about 10 Torr.

9. A process according to claim 1 wherein the formation of the layer of photoresist on the substrate is effected using a photoresist composition comprising a photoresist and a dye, so that the filter elements are formed with the dye already contained therein.

10. A process according to claim 9 wherein the photoresist is a positive photoresist comprising a novolak resin and a sensitizer.

11. A process according to claim 10 wherein at least part of the photoresist composition has the sensitizer covalently bonded to the novolak resin.

12. A process according to claim 9 wherein the photoresist composition contains at least about 10 percent by weight of the dye on a dry basis.

13. A process according to claim 1 wherein the development of the photoresist is effected by contacting the photoresist with an aqueous alkaline solution.

14. A process according to claim 1 wherein the substrate is a solid state imager or a liquid crystal display device.

15. A process according to claim 14 wherein the solid state imager is a charge coupled device or a complementary metal oxide semiconductor imager.

16. A process according to claim 15 wherein the charge coupled device is of a type comprising a plurality of spaced elements each defined by a surrounding channel stop, and wherein the process further comprises the step of predetermining the portions of the layer of photoresist to be exposed to radiation by masking selected ones of the spaced elements in such a manner that the edges of the filter elements formed after the exposure and development extend over the channel stop surrounding the selectively masked elements.

17. A process according to claim 16 wherein, after the filter elements have been formed, discrete areas of photoresist are formed overlying the filter elements, and these areas of photoresist are then melted to form microlenses overlying the filter elements.

18. A process according to claim 17 wherein, after the filter elements have been formed but prior to the formation of the discrete areas of photoresist, the substrate is treated with a silylation compound having at least two functional groups, this silylation compound being capable of cross-linking the photoresist used in said discrete areas, and of promoting adhesion of this photoresist to the substrate and/or the filter elements.

19. A process for forming a filter on a substrate, this substrate comprising a solid state imager or a liquid crystal display device, which process comprises:

forming, on the solid state imager, a layer of a first photoresist composition comprising a photoresist and a first dye;

exposing portions of the layer of first photoresist composition to radiation effective to change the solubility of the exposed portions of the photoresist composition;

developing the exposed layer of first photoresist composition by removing from the substrate one of the exposed and unexposed portions of the layer of first photoresist composition, thereby producing first filter elements from the remaining portions of the layer of first photoresist composition;

thereafter, treating the substrate with a silylation compound having at least two functional groups, this silylation compound being capable of cross-linking the photoresist in the first filter elements, and of promoting adhesion of this photoresist to the substrate;

thereafter forming, on the substrate bearing the first filter elements, a layer of a second photoresist composition comprising a photoresist and a second dye, the second dye having radiation absorption characteristics different from those of the first dye;

exposing portions of the layer of second photoresist composition to radiation effective to change the solubility of the exposed portions of the photoresist composition;

developing the exposed layer of second photoresist composition by removing from the substrate one of the exposed and unexposed portions of the layer of second photoresist composition, thereby producing second filter elements from the remaining portions of the layer of second photoresist composition;

thereafter, treating the substrate with a silylation compound having at least two functional groups, this silylation compound being capable of cross-linking the photoresist in the second filter elements, and of promoting adhesion of this photoresist to the substrate;

thereafter forming, on the substrate bearing the first and second filter elements, a layer of a third photoresist composition comprising a photoresist and a third dye, the third dye having radiation absorption characteristics different from those of the first and second dyes;

exposing portions of the layer of third photoresist composition to radiation effective to change the solubility of the exposed portions of the photoresist composition;

developing the exposed layer of third photoresist composition by removing from the substrate one of the exposed and unexposed portions of the layer of third photoresist composition, thereby producing third filter elements from the remaining portions of the layer of third photoresist composition; and thereafter, treating the substrate with a silylation compound having at least two functional groups, this silylation compound being capable of cross-linking the photoresist in the third filter elements.

20. A process according to claim 19 wherein the substrate is not heated substantially above ambient temperature between the first development step and the formation of the layer of second photoresist composition except during the second treatment with the silylation compound, or between the second development step and the formation of the layer of third photoresist composition except during the third treatment with the silylation compound.

21. A process according to claim 19 wherein, prior to the formation of layer of the first photoresist composition, the substrate is treated with a silylation compound having at least two functional groups, this silylation compound being capable of promoting adhesion of this photoresist to the substrate.

22. A process according to claim 19 wherein, after the first, second and third filter elements have been formed, discrete areas of photoresist are formed overlying the first, second and third filter elements, and these areas of photoresist are then melted to form microlens overlying the first, second and third filter elements.

23. A solid state imager having a radiation-sensitive surface bearing a filter comprising first, second and third sets of filter elements, these filter elements comprising a photoresist, each of the filter elements having the same radiation absorption characteristics as the other filter elements of the set to which it belongs but different radiation absorption characteristics from the filter elements of the other two sets, and wherein at least one of the sets of filter elements contains a residue of a silylation compound capable of cross-linking the photoresist and of promoting adhesion of the photoresist to the radiation-sensitive surface of the solid state imager.

24. A liquid crystal display device comprising a plurality of liquid crystal light gates and a viewing surface through which these light gates can be viewed, the viewing surface having a radiation-sensitive surface bearing a filter comprising first, second and third sets of filter elements, these filter elements comprising a photoresist, each of the filter elements having the same radiation absorption characteristics as the other filter elements of the set to which it belongs but different radiation absorption characteristics from the filter elements of the other two sets, and wherein at least one of the sets of filter elements contains a residue of a silylation compound capable of cross-linking the photoresist and of promoting adhesion of the photoresist to the viewing surface.

25. A process for forming microlenses on a substrate, which process comprises:

forming first second and third sets of discrete photoresist elements on the substrate, each of the first, second and third sets being of a different color;

thereafter melting the photoresist elements to form three sets of microlenses on the substrate; and thereafter treating the substrate with a silylation compound capable of cross-linking the photoresist in the photoresist elements.

\* \* \* \* \*